United States Patent
Ünlü et al.

(10) Patent No.: US 10,705,138 B2
(45) Date of Patent: Jul. 7, 2020

(54) OPTICAL ANTENNAS FOR ADVANCED INTEGRATED CIRCUIT TESTING

(71) Applicant: Trustees of Boston University, Boston, MA (US)

(72) Inventors: M. Selim Ünlü, Newton, MA (US); Bennett B. Goldberg, Newton, MA (US); Yusuf Leblebici, Lausanne (CH)

(73) Assignee: Trustees of Boston University, Boston, MA (US)

( * ) Notice: Subject to any disclaimer, the term of this patent is extended or adjusted under 35 U.S.C. 154(b) by 649 days.

(21) Appl. No.: 15/203,282

(22) Filed: Jul. 6, 2016

(65) Prior Publication Data
US 2016/0313395 A1 Oct. 27, 2016

Related U.S. Application Data

(63) Continuation of application No. PCT/US2014/073004, filed on Dec. 31, 2014.
(Continued)

(51) Int. Cl.
*G01R 31/311* (2006.01)
*H01L 21/66* (2006.01)
*G01R 31/28* (2006.01)

(52) U.S. Cl.
CPC ........ *G01R 31/311* (2013.01); *G01R 31/2856* (2013.01); *H01L 22/12* (2013.01); *H01L 22/14* (2013.01)

(58) Field of Classification Search
CPC ................................................. G01R 31/311; G01R 31/2856; G01R 31/308; G01R 31/309; G01R 31/2884;
(Continued)

(56) References Cited

U.S. PATENT DOCUMENTS

| 6,501,288 B1 | 12/2002 | Wilsher |
| 6,686,755 B2 * | 2/2004 | White ................ G01R 31/2851 324/754.31 |

(Continued)

FOREIGN PATENT DOCUMENTS

| WO | 0072030 A1 | 11/2000 |
| WO | 2014014805 A1 | 1/2014 |

OTHER PUBLICATIONS

Coppens et al. "Probing and Controlling Photothermal Heat Generation in Plasmonic Nanostructures," Nano Letters, 13, 1023-1028 (2013).*
(Continued)

*Primary Examiner* — Lee E Rodak
(74) *Attorney, Agent, or Firm* — BainwoodHuang

(57) ABSTRACT

A device testing approach employs optical antennas at test locations of a semiconductor device, usable as either/both radiators or receivers. As a radiator, an antenna responds to localized optical energy at a test location of the device to generate corresponding radiated optical energy that can be sensed and processed by a test system. As a receiver, an antenna receives radiated optical energy as generated by a test system and converts the energy into corresponding localized optical energy for affecting operation of the device. The optical antennas may be formed from metal segments on the same metal layers used for signal interconnections in the device, and thus the disclosed approach can provide enhanced test functionality without burdening the device manufacturing process with additional complexity solely to support testing. The testing approach may be used in different modalities in which the antennas variably act as transmitters, receivers, and reflectors/refractors.

7 Claims, 3 Drawing Sheets

Related U.S. Application Data

(60) Provisional application No. 61/923,875, filed on Jan. 6, 2014.

(58) Field of Classification Search
CPC .......... G01R 31/3025; G01R 31/31728; H01L 22/14; H01L 22/12
See application file for complete search history.

(56) References Cited

U.S. PATENT DOCUMENTS

| | | | |
|---|---|---|---|
| 7,064,568 | B2 | 6/2006 | Hunt et al. |
| 7,801,325 | B1 | 9/2010 | Hetzel et al. |
| 8,294,483 | B2 | 10/2012 | Pessoa et al. |
| 2005/0127933 | A1 | 6/2005 | Wills |
| 2006/0103378 | A1* | 5/2006 | Pakdaman ............ G01R 31/311 324/228 |
| 2007/0058686 | A1 | 3/2007 | Capasso et al. |
| 2009/0295415 | A1* | 12/2009 | Pessoa ................ G01R 31/2884 324/750.01 |
| 2010/0156640 | A1 | 6/2010 | Forster |
| 2010/0232810 | A1* | 9/2010 | Hillis .................... B82Y 20/00 398/202 |

OTHER PUBLICATIONS

Novotny, et al., "Antennas for light", Nature Photonics, vol. 5, Feb. 1, 2011, www.nature.com/naturephotonics, DOI: 10.1038/NPHOTON.2010.237, pp. 83-90.

\* cited by examiner

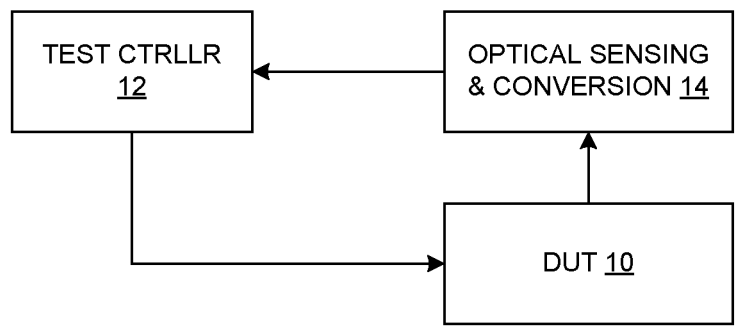
Fig. 1
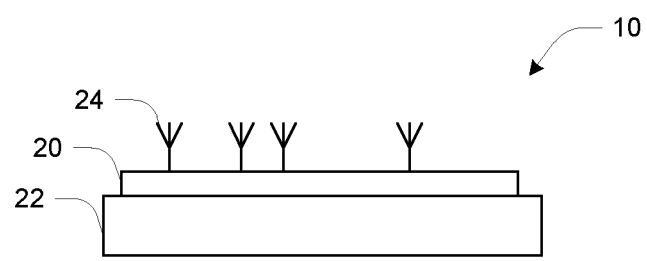
Fig. 2
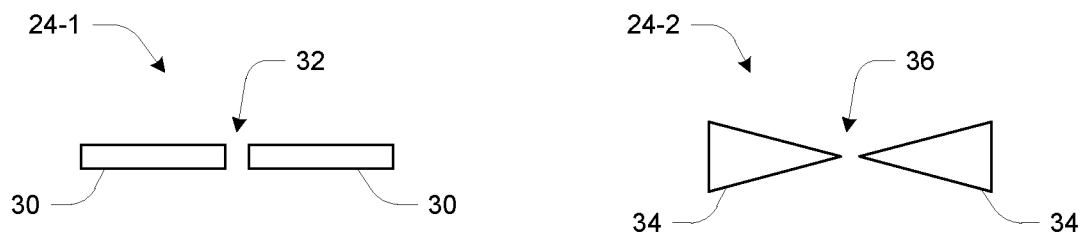
Fig. 3
Fig. 4

OPTICAL ANTENNAS FOR ADVANCED INTEGRATED CIRCUIT TESTING

BACKGROUND

The present invention is related to the field of integrated circuit testing.

As feature sizes have continued to decrease in the progression of integrated circuit technology, the challenges of adequately testing manufactured devices have grown. It has already become infeasible to include electrical test points at internal circuit nodes, and thus more recent testing approaches include optical techniques in which optical energy is focused at test locations. However, fundamental optical resolution limits have been reached even for current devices, and thus existing optical techniques is inadequate for accurate device testing in current and future semiconductor manufacturing processes.

SUMMARY

Disclosed is a device testing approach that employs optical antennas deployed at selected test locations of a semiconductor device. The optical antennas can be used as either/both radiators or receivers. As a radiator, an antenna responds to localized optical energy at a test location of the device to generate corresponding radiated optical energy that can be sensed and processed by a test system. As a receiver, an antenna receives radiated optical energy as generated by a test system for example and converts this energy into corresponding localized optical energy for affecting operation of the device. The optical antennas may be formed from metal segments on the same metal layers used for signal interconnections in the device, and thus the disclosed approach can provide enhanced test functionality without burdening the device manufacturing process with additional complexity solely to support testing. Moreover, the use of optical antennas enables a test system to differentiate or resolve two minimally spaced devices even at current and future reduced-dimension processing nodes.

More particularly, both a semiconductor device and methods for testing a semiconductor device are disclosed. In one embodiment the semiconductor device includes functional circuit elements formed by registered and interconnected segments of semiconductor material and metal at respective layers of the device, and optical antennas formed to receive and radiate optical energy to test points at selected test locations for the functional circuit elements on the device. The optical antennas convert between radiated optical energy to or from a test system and corresponding localized optical energy at the test locations. In one more specific embodiment, functional circuitry at the test locations operates in response to the localized optical energy to create a light-induced change of a local electrical parameter selected from a voltage and a current, and this change can be detected by monitoring electrical operation of the device. In another specific embodiment, the antennas are configured and operable to transmit radiated optical energy away from the semiconductor device in response to localized optical energy at the test locations, and the device can be tested by operating the semiconductor device to cause functional circuit elements at the test locations to emit the localized optical energy and sensing a pattern of radiated optical energy indicating whether the functional circuit elements operate in accordance with a predetermined test criteria.

Disclosed testing approaches may use various distinct modalities in which the antennas variably act as transmitters, receivers, and reflectors/refractors/diffractors.

One disclosed method of manufacturing and testing of a semiconductor device includes (1) incorporating optical antennas at test locations of the semiconductor device, the antennas being configured and operable to transmit radiated optical energy away from the semiconductor device in response to localized optical energy at the test locations, (2) operating the semiconductor device to cause functional circuit elements at the test locations to emit the localized optical energy having a pattern indicative of specific operations of the functional circuit elements, (3) sensing the radiated optical energy and converting it into one or more corresponding electrical signals representative of the localized optical energy at the test locations of the semiconductor device, and (4) processing the electrical signals by a test controller to determine whether the electrical signals indicate that the functional circuit elements operate in accordance with a predetermined test criteria.

As used herein, the term "test location" refers to the location of functional circuit element(s) being tested, specifically a location of localized optical energy, and in some contexts it also refers to an optical antenna disposed near such circuit element(s) to generate or receive such localized optical energy. For example, an optical antenna may be formed above a circuit element in metal and interconnect layers.

A further disclosed method of manufacturing and testing of a semiconductor device includes (1) incorporating optical antennas at test locations of the semiconductor device, the antennas being configured and operable to convert radiated optical energy directed at the semiconductor device to localized optical energy at the test locations, (2) operating a test controller to generate electrical signals indicative of optical energy to be directed to the test locations, and converting the electrical signals into corresponding optical signals and radiatively transmitting the optical signals to the optical antennas to deliver the localized optical energy to the corresponding test locations, the localized optical energy causing functional circuit elements at the test locations to perform specific operations, and (3) sensing and processing electrical signals from the functional circuit elements indicative of operation of the functional circuit elements in response to the localized optical energy, the processing performed by the test controller and determining whether the electrical signals indicate that the functional circuit elements operate in accordance with a predetermined test criteria.

A disclosed method of verifying correct manufacture of a semiconductor device includes (1) generating a pattern of radiated optical energy and direct it to the semiconductor device, the semiconductor device when correctly manufactured including (i) functional circuit elements formed by a pattern of registered and interconnected segments of semiconductor material and metal at respective layers of the device, and (ii) optical antennas formed by a pattern of segments of antenna material included in the layers of the device, the optical antennas being dimensioned and configured to respond to the radiated optical energy by generating a corresponding predetermined pattern of radiated optical energy uniquely associated with the pattern of segments of antenna material, and (2) sensing an actual pattern of optical energy radiating from the device and comparing it to the predetermined pattern, the comparing generating a match indication when the compared patterns match to at least a predetermined minimum degree, and otherwise refraining from generating the match indication."

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views.

FIG. 1 is a block diagram of a semiconductor testing arrangement;

FIG. 2 is a schematic side view of a semiconductor device;

FIGS. 3 and 4 are quasi-mechanical plan views of optical antennas;

DETAILED DESCRIPTION

Figure 5:
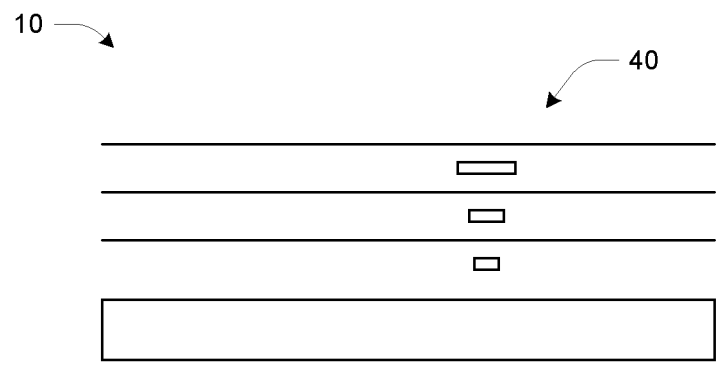
FIGS. 5 and 6 are schematic depictions of front-side and back-side testing modes respectively.

FIG. 1 shows a system in which a device under test (DUT; referred to as "device" herein) 10 is tested by apparatus including a test controller (TEST CTRLLR) 12 and optical sensing and conversion circuitry 14. The device 10 is a semiconductor device including optical antennas serving as test points, as described more below. During a test operation, the device 10 is electrically energized and its circuitry is activated. Localized energy at selected locations in the circuitry is converted by the optical antennas into radiated optical energy that is sensed by optical sensors in the optical sensing and conversion circuitry 14. The sensed optical energy is converted into electrical signals that are provided to the test controller 12, where the signals are evaluated in some manner according to a test that is being performed. For example, during a given test a correctly operating device 10 will create localized energy at a given location, and the presence or absence of that energy is detected by monitoring an optical output of an optical antenna output at a corresponding test point. The optical output is represented by a corresponding electrical signal provided by the optical sensing and conversion circuitry 14 to the test controller 12. If this electrical signal indicates that a required level of optical energy has been detected, then this aspect of the test is satisfied (i.e., the device 10 is deemed to be correctly generating the localized energy). If this electrical signal indicates that a required level of optical energy has not been detected, then this aspect of the test fails (i.e., the device 10 is deemed to be incorrectly failing to generate the localized energy).

The localized energy of the circuit may be in different forms. In some cases, it may already be an optical signal directly generated by circuit elements. In one example such an optical signal may be in the infrared range. In other cases, the localized energy may be in electrical form, and an element is used to convert the localized electrical energy into localized optical energy that is then provided to the on-device antenna.

FIG. 1 illustrates only a sensing aspect of testing, i.e., using the optical sensing and conversion circuitry 14 only to sense optical energy generated by the device 10. In other embodiments outlined below, a system may also direct optical energy to a device 10 for purposes of influencing how it operates. It will be appreciated that in this case optical antennas are operating to collect received radiated optical energy and generate corresponding localized optical energy that is directed to circuit elements to affect their electrical operation.

FIG. 2 shows the composition of the device 10 at a high level. It includes circuitry 20 formed on a substrate 22 such as a silicon die. As generally known, the circuitry 20 in modern semiconductor devices can be quite complex, including for example several layers of metallization for carrying electrical signals within and among circuit components. Formed along with the circuitry 20 are optical antennas 24, located to serve as test points where localized energy is to be sensed or injected by the antennas 24. The antennas 24 may generally be formed by any suitable material. At certain optical frequencies, nanoscale metal structures can provide sufficient conductivity to serve as antenna elements. Additionally, the required sizes for antennas at optical frequencies are of the same order as feature sizes in current semiconductor devices. Thus in one embodiment optical antennas may be constituted by metal structures defined and formed using the same techniques for defining and forming the metal structures that convey electrical signals in the device.

In particular, current semiconductor processes include the so-called "22 nm" processes for creating transistors, metal lines, and other structures with minimum feature sizes on the order of 22 nm. A first-level metal layer is about 100 nm from the semiconductor layer in which the transistors are formed, and adjacent layers are separated by as little as 50 nm. These structures are suitable for forming optical antennas that can collect/radiate optical energy directed to/from very small localized areas of a device 10. It is noted that in many designs no more than a small fraction of metal structures actually have electrical functionality—remaining portions are used more for process uniformity purposes to provide etch and process uniformity. These additional structures without a electrical function purpose can be designed as antenna structures for testing and watermarking as described herein.

FIGS. 3 and 4 show example optical antenna structures. In FIG. 3, a first example antenna 24-1 is configured as a basic linear dipole, including two linear segments 30 separated by a small gap 32. A typical configuration is half-wave, i.e., the overall length along the two segments is one-half the wavelength of the optical signal. The antenna 24-1 transfers localized optical energy at the gap 32 to radiated optical energy, and vice-versa. In FIG. 4, a second example antenna 24-2 has a so-called "bowtie" configuration, which is a dipole in which the segments 34 are separated by a gap 36 and have triangular shapes as shown. A bowtie antenna such as antenna 24-2 typically exhibits wider operating bandwidth than the basic linear dipole 24-1 of FIG. 3.

Figure 6:
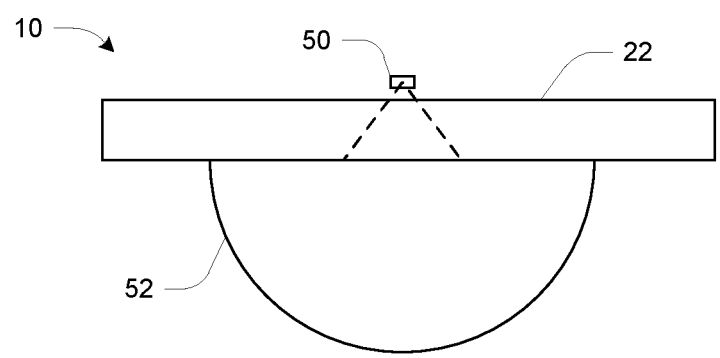

FIGS. 5 and 6 illustrate two different modes of testing a device 10 using optical signals and optical antennas as described herein. FIG. 5 shows a front-side testing mode in which optical energy is detected and/or introduced at a front or top side of the device 10, i.e., the side on which the circuit elements, metal, and other structures are formed in conventional one-sided semiconductor manufacturing. As shown, an example antenna 40 is formed by three registered segments of metal on different layers. The antenna 40 can be made in relatively small area and easily intermixed with other structures without compromising its operation.

FIG. 6 shows a back-side testing mode in which optical energy is detected and/or introduced at a back or bottom side of the device 10, i.e., the unprocessed surface of the semiconductor substrate for the device 10. Item 50 is an optical antenna formed at a given location on the front surface of the device 10. A lens 52 may be placed against the backside of the device 10 to provide for focusing optical energy at the antenna 50. It will be appreciated that in the back-side testing mode the optical wavelengths are outside the visible range and in a range in which the semiconductor substrate 22 is transmissive. The lens 52 may be a so-called solid immersion lens or SIL, and in particular may be of a type referred to as a numerical-aperture increasing lens or NAIL.

Figure 7:
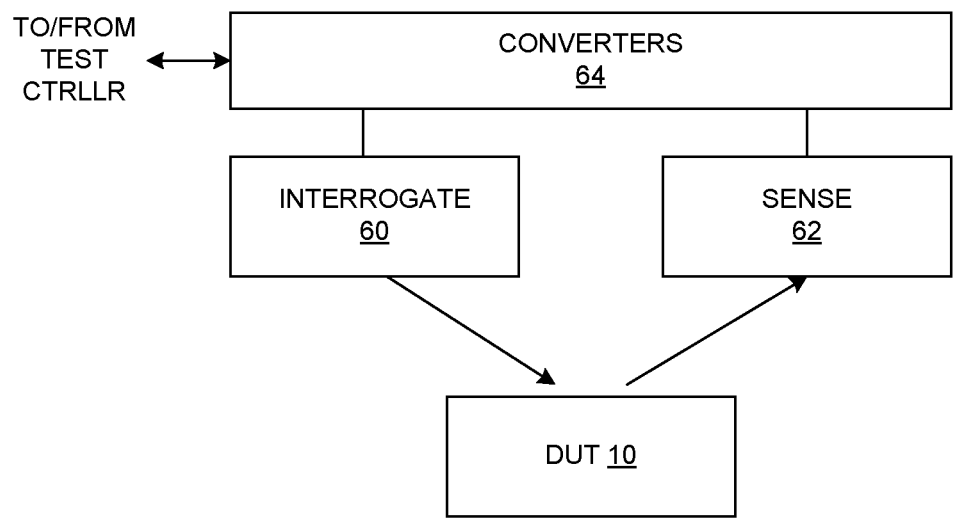
FIG. 7 is a block diagram of a semiconductor testing arrangement.

FIG. 7 shows an alternative test arrangement to that of FIG. 1, in which the test system includes interrogation circuitry 60, sensing circuitry 62 and converter circuitry 64. The interrogation circuitry 60 is operative to direct optical energy to the device 10, thereby delivering localized optical energy at locations where optical antennas 24 are formed. The sensing circuitry 62 detects optical energy radiated from optical antennas 24 of the device 10. The converter circuitry provides conversion between the optical signals to/from the interrogation circuitry 60 and sensing circuitry 62 and the electrical signals to/from the test controller 12 (FIG. 1).

Another use of optical antenna technology in semiconductor devices is to assess mechanical correctness. For example, it can be used to assess proper overlay registration of the various layers of the device, by comparing a measured pattern of optical radiation received from the device to a predetermined expected pattern generated by a device meeting a predetermined standard of overlay registration. A similar use can be referred to as "optical watermarking"—incorporating predetermined mechanical patterns for generating corresponding optical patterns, and testing for these patterns to ascertain whether the design and/or layout of the device has been changed in some unauthorized manner. Such optical watermarking testing may be useful in the context of outsourced manufacturing, for example, as a tool for testing for deviations from design.

Figure 8:
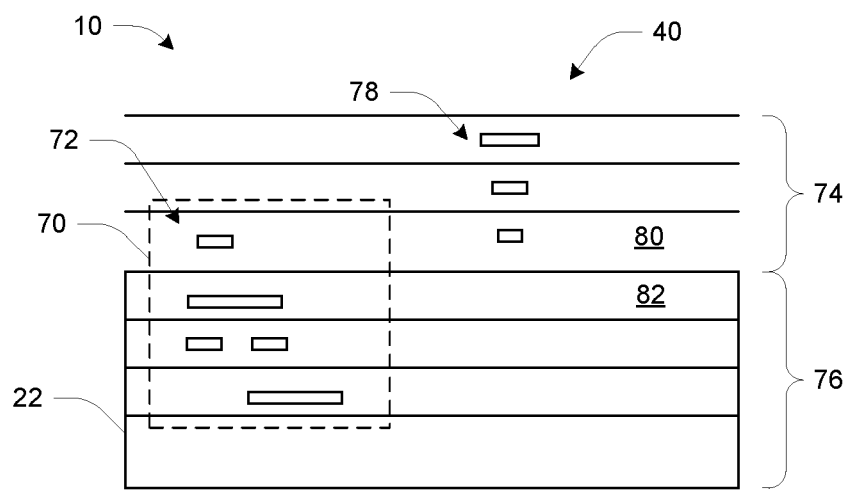
FIG. 8 is a schematic side view of a semiconductor device.

FIG. 8 illustrates a semiconductor device 10 that includes functional circuit elements formed by registered and interconnected segments of semiconductor material and metal at respective layers of the device. In this simplified example a functional circuit element 70 is shown that is formed by a set of such segments 72 at the metal layers 74 and the semiconductor layers 76 of the substrate 22. Analogous functional elements are distributed across the device 10 as generally known. Also in this example, an optical antenna 40 is constituted by segments of metal 78 formed at one or more of the metal interconnection layers 74. Analogous antennas are also distributed across the device 10. The metal interconnection layers 74 include a first layer metal 80 closest to an active semiconductor layer 82 of the semiconductor device.

While in the above description example antennas 24 are described as being formed of metal elements, in alternative embodiments they may be formed of other materials consistent with the manufacturing processes for a device 10. For use with shorter wavelength optical signals that may not propagate as well in metal, it may be desirable to employ materials/structures such as carbon nanotubes in other embodiments.

While various embodiments of the invention have been particularly shown and described, it will be understood by those skilled in the art that various changes in form and details may be made therein without departing from the spirit and scope of the invention as defined by the appended claims.

What is claimed is:

1. A semiconductor device, comprising:
   functional circuit elements formed by registered and interconnected segments of semiconductor material and metal at respective layers of the device; and
   optical antennas formed as optical test points at selected test locations for the functional circuit elements on the device, the optical antennas converting between radiated optical energy to or from a test system and corresponding localized optical energy at the test locations, the optical antennas being formed from metal segments on the same metal layers used for signal interconnections within and between the functional circuit elements,
   wherein the metal includes first portions and second portions, the first portions including metal having electrical functionality in the functional circuit elements, the second portions including (i) first metal segments lacking electrical functionality and providing etch and process uniformity, and (ii) second metal segments forming the optical antennas.

2. A semiconductor device according to claim 1, wherein the optical antennas are constituted by segments of metal formed at one or more metal interconnection layers of the semiconductor device.

3. A semiconductor device according to claim 2, wherein the metal interconnection layers include a first layer metal closest to an active semiconductor layer of the semiconductor device.

4. A semiconductor device according to claim 2, wherein one or more of the optical antennas is a vertical antenna formed by segments of metal from multiple adjacent metal layers.

5. A semiconductor device according to claim 1, wherein circuitry at the test locations operates in response to the localized optical energy to create a light-induced change of a local electrical parameter selected from a voltage and a current.

6. A semiconductor device according to claim 1, wherein circuitry at the test locations operates in response to a light-induced local temperature change caused by the localized optical energy.

7. A semiconductor device according to claim 1, wherein the functional circuit elements include two devices located sufficiently close to each other that their locations cannot be resolved based on the radiated optical energy, and wherein an optical antenna is located and configured such that the respective localized optical energy is localized at one of the devices to permit resolution of the devices by the test system.

* * * * *